(12) United States Patent
Tamegai

(10) Patent No.: US 10,101,399 B2
(45) Date of Patent: Oct. 16, 2018

(54) APPARATUS FOR ESTIMATING RESIDUAL BATTERY CAPACITY, SYSTEM FOR ESTIMATING RESIDUAL BATTERY CAPACITY, BATTERY PACK, AND METHOD FOR ESTIMATING RESIDUAL BATTERY CAPACITY

(71) Applicant: ROHM CO., LTD., Ukyo-ku, Kyoto (JP)

(72) Inventor: Yoichi Tamegai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 137 days.

(21) Appl. No.: 15/168,681

(22) Filed: May 31, 2016

(65) Prior Publication Data

US 2016/0356855 A1    Dec. 8, 2016

(30) Foreign Application Priority Data

Jun. 2, 2015  (JP) ................................ 2015-112107

(51) Int. Cl.
*G01R 31/36*  (2006.01)
*H01M 10/42*  (2006.01)
(Continued)

(52) U.S. Cl.
CPC ...... *G01R 31/3624* (2013.01); *H01M 10/425* (2013.01); *H01M 10/44* (2013.01); *H01M 10/486* (2013.01)

(58) Field of Classification Search
CPC .......... A61N 1/378; G01R 1/20; G01R 1/203; G01R 19/25; G01R 31/36; G01R 31/3606; G01R 31/3613; G01R 31/3624; G01R 31/3662; G01R 31/3693; H01M 10/48; H01M 10/486; H01M 10/42; H01M 10/425; H01M 10/44
See application file for complete search history.

(56) References Cited

U.S. PATENT DOCUMENTS

2013/0282316 A1* 10/2013 Goto .................. G01R 31/3679
                                                                    702/63
2014/0132222 A1*  5/2014 Joe ..................... G01R 31/3651
                                                                    320/134
(Continued)

FOREIGN PATENT DOCUMENTS

JP          2000228227 A     8/2000

*Primary Examiner* — Son Le
(74) *Attorney, Agent, or Firm* — Cantor Colburn LLP

(57) ABSTRACT

An apparatus for estimating a residual capacity of a storage battery including an electrode whose stage structure is changed based on a state of includes a current monitor configured to monitor a current value flowing in the storage battery; a voltage monitor configured to monitor a voltage value of the storage battery; a Coulomb counter configured to integrate the current value monitored by the current monitor; a differentiation circuit configured to detect a differential value of the voltage value monitored by the voltage monitor; a reset detecting circuit configured to reset an accumulated error due to current integration of the Coulomb counter using an inflection point of the differential value detected by the differentiation circuit; and a residual capacity estimating part configured to estimate a residual capacity of the storage battery based on a value of the Coulomb counter.

21 Claims, 16 Drawing Sheets

(51) Int. Cl.
*H01M 10/44* (2006.01)
*H01M 10/48* (2006.01)

(56) References Cited

U.S. PATENT DOCUMENTS

2014/0184314 A1* 7/2014 Takahashi .......... G01R 31/3613
                                                        327/524
2016/0356856 A1* 12/2016 Hongo ............... G01R 31/3634

* cited by examiner

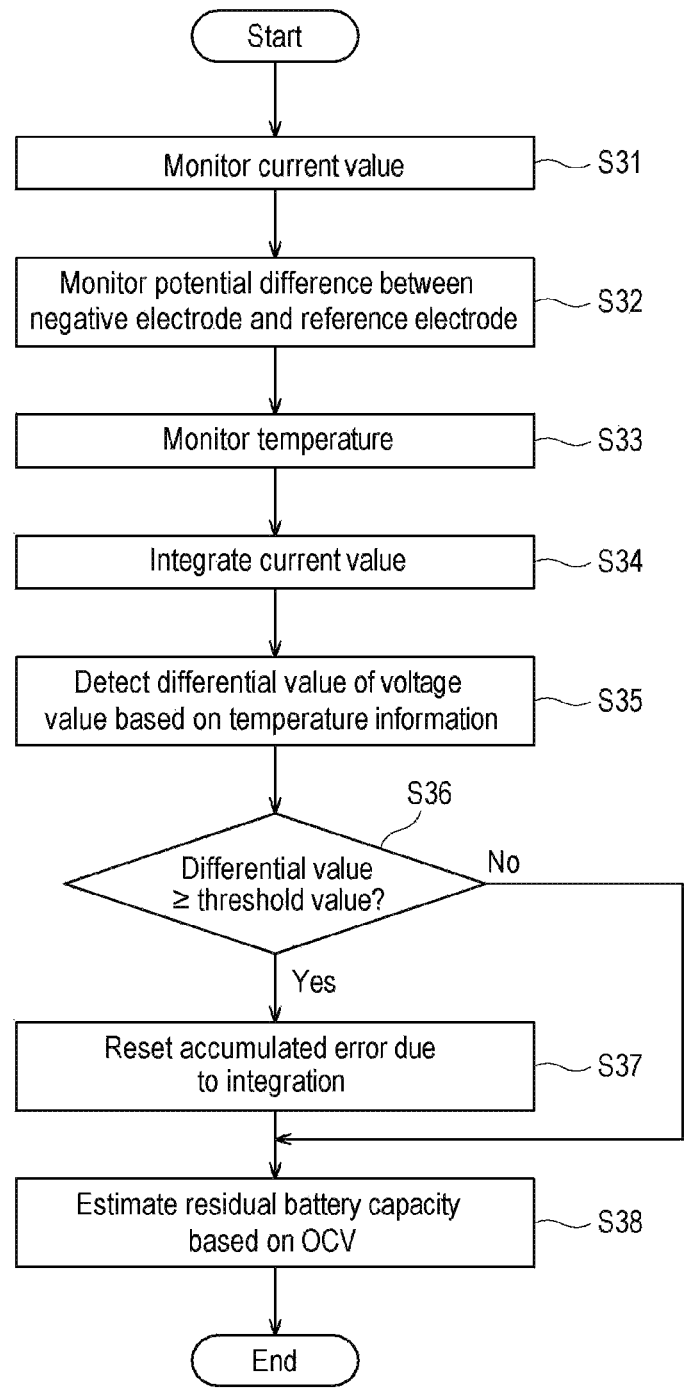

APPARATUS FOR ESTIMATING RESIDUAL BATTERY CAPACITY, SYSTEM FOR ESTIMATING RESIDUAL BATTERY CAPACITY, BATTERY PACK, AND METHOD FOR ESTIMATING RESIDUAL BATTERY CAPACITY

CROSS-REFERENCE TO RELATED APPLICATION(S)

This application is based upon and claims the benefit of priority from Japanese Patent Application No. 2015-112107, filed on Jun. 2, 2015, the entire contents of which are incorporated herein by reference.

TECHNICAL FIELD

The present disclosure relates to an apparatus for estimating a residual battery capacity, a system for estimating a residual battery capacity, a battery pack, and a method for estimating a residual battery capacity.

BACKGROUND

Recently, storage batteries such as lithium ion batteries that may be repeatedly charged or discharged have been used in various fields such as portable devices, automobiles, etc. In order to improve the usability of devices using a storage battery, it is important to know how long the device will be operable. Thus, most devices using a storage battery have a function of calculating and displaying a residual capacity of the storage battery.

As typical methods of estimating a residual capacity of a storage battery, there are an open circuit voltage (OCV) measurement method and a Coulomb counting method. The OCV measurement method is a method of measuring an OCV of a storage battery in advance and creating a table of the measured OCV. According to the OCV measurement method, it is possible to obtain an accurate value during normal use. The Coulomb counting method is a method of estimating an amount of internal charges by frequently monitoring an inflow/outflow of electric charges to and from a storage battery. The Coulomb counting method is resistant to a load fluctuation such as an inrush current, and thus obtains a stable residual capacity.

However, the Coulomb counting method has shortcomings in that errors may be easily accumulated due to current integration.

Meanwhile, the OCV measurement method has the following problems. First, when a load greatly fluctuates within a short time, a calculation value is likely to fluctuate. Further, the OCV measurement method is based on a premise that a sufficient time should pass after charging and discharging and a storage battery should be stable. In addition, in a state where charging and discharging are continuously performed, a fluctuation in an open circuit voltage of a storage battery is not considered. In particular, a fluctuation of an open circuit voltage is increased at low temperatures, and an error of residual capacity based on an estimate value of an open circuit voltage in a normal state is increased.

Currently, a hybrid scheme that combines the Coulomb counting method and the OCV measurement method is the mainstream, but it is difficult to exclude an accumulated error due to current integration by simply combining both techniques. In particular, the calculation precision of residual capacity may be lowered or a calculation value of residual capacity may be rapidly changed in a state where discharging is continued like a hybrid vehicle, and it is difficult to secure stable precision.

SUMMARY

The present disclosure provides some embodiments of an apparatus for estimating a residual battery capacity, a system for estimating a residual battery capacity, a battery pack, and a method for estimating a residual a battery capacity, which are capable of precisely estimating a residual capacity of a storage battery through simple processing.

According to one embodiment of the present disclosure, there is provided an apparatus for estimating a residual capacity of a storage battery including an electrode whose stage structure is changed based on a state of charge, including: a current monitor configured to monitor a current value flowing in the storage battery; a voltage monitor configured to monitor a voltage value of the storage battery; a Coulomb counter configured to integrate the current value monitored by the current monitor; a differentiation circuit configured to detect a differential value of the voltage value monitored by the voltage monitor; a reset detecting circuit configured to reset an accumulated error due to current integration of the Coulomb counter using an inflection point of the differential value detected by the differentiation circuit; and a residual capacity estimating part configured to estimate a residual capacity of the storage battery based on a value of the Coulomb counter.

According to another embodiment of the present disclosure, there is provided a system for estimating a residual capacity of a battery, including: a storage battery including an electrode whose stage structure is changed based on a state of charge; and a load device configured to supply power from the storage battery, wherein the load device includes a residual battery capacity estimating apparatus for estimating a residual capacity of the storage battery, and the residual battery capacity estimating apparatus includes: a current monitor configured to monitor a current value flowing in the storage battery; a voltage monitor configured to monitor a voltage value of the storage battery; a Coulomb counter configured to integrate the current value monitored by the current monitor; a differentiation circuit configured to detect a differential value of the voltage value monitored by the voltage monitor; a reset detecting circuit configured to reset an accumulated error due to current integration of the Coulomb counter using an inflection point of the differential value detected by the differentiation circuit; and a residual capacity estimating part configured to estimate a residual capacity of the storage battery based on a value of the Coulomb counter.

According to still another embodiment of the present disclosure, there is provided a battery pack, including: a storage battery including an electrode whose stage structure is changed based on a state of charge; and a residual battery capacity estimating apparatus for estimating a residual capacity of the storage battery, wherein the residual battery capacity estimating apparatus includes: a current monitor configured to monitor a current value flowing in the storage battery; a voltage monitor configured to monitor a voltage value of the storage battery; a Coulomb counter configured to integrate the current value monitored by the current monitor; a differentiation circuit configured to detect a differential value of the voltage value monitored by the voltage monitor; a reset detecting circuit configured to reset an accumulated error due to current integration of the Coulomb counter using an inflection point of the differential value detected by the differentiation circuit; and a residual capacity estimating part configured to estimate a residual capacity of the storage battery based on a value of the Coulomb counter.

According to a further embodiment of the present disclosure, there is provided a method for estimating a residual capacity of a storage battery including an electrode whose stage structure is changed based on a state of charge by a residual battery capacity estimating apparatus, including: monitoring a current value flowing in the storage battery; monitoring a voltage value of the storage battery; integrating the current value monitored in the monitoring a current value; detecting a differential value of the voltage value monitored in the monitoring a voltage value; resetting an accumulated error due to current integration of the Coulomb counter using an inflection point of the differential value detected in the detecting a differential value; and estimating a residual capacity of the storage battery based on a value of the Coulomb counter.

BRIEF DESCRIPTION OF THE DRAWINGS

FIG. 16 is a flowchart illustrating a method for estimating a residual battery capacity according to the fourth embodiment.

DETAILED DESCRIPTION

Figure 1:
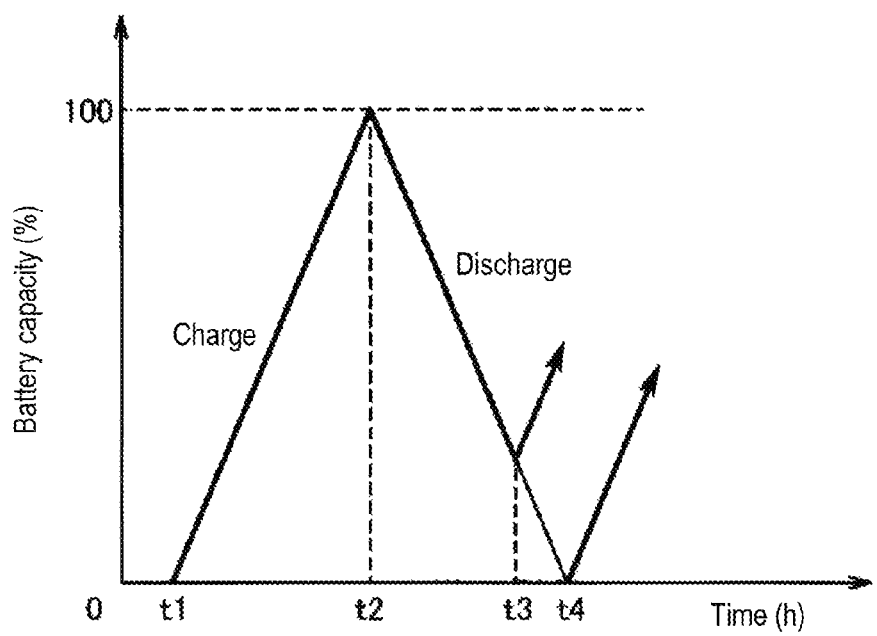
FIG. 1 is a graph illustrating an operation of resetting a Coulomb counter.

Embodiments of the present disclosure will be now described in detail with reference to the drawings. In the following description of the drawings, like or similar reference numerals are used for like or similar parts. However, it should be noted that the drawings are schematic, and the relationships between thicknesses and planar dimensions, the thickness ratios of respective layers, and the like are different from the actual ones. Thus, specific thicknesses or dimensions should be determined in consideration of the following description. Also, it is understood that parts having different dimensional relationships or ratios are included among the drawings.

Further, the embodiments described below are presented to illustrate apparatuses or methods for embodying the technical concept of the present disclosure and are not intended to limit the materials, features, structures, arrangements, and the like of the components to those shown below. The embodiments may be variously modified within the scope of claims.

[Coulomb Counting Method]

A Coulomb counting method is a method of measuring a current flowing into or out of a storage battery to calculate an amount of charge increased or decreased within the storage battery so as to monitor an increase or decrease in a state of charge (SOC) of the storage battery. In this method, since the electric charges flowing into or out of the storage battery is actually constantly monitored, an increase or decrease in the SOC may be calculated with high precision, but a calculation formula is relative over time and thus it is impossible to calculate an absolute SOC. Thus, before the SOC is calculated, an initialization operation is required to measure information of how many electric charges flow into the storage battery in advance until the storage battery is filled with the electric charges from an empty state of the electric charges in the storage battery to be measured, as an initial value.

In addition, when a load fluctuation occurs in a load device side at a time earlier than a monitoring period, since a movement amount of electric charges at that time cannot be detected, a calculated SOC value has an error with respect to an actual SOC value and the erroneous SOC values are accumulated little by little. In order to correct the accumulated error, it is required to perform an initialization operation periodically in the Coulomb counting method.

FIG. 1 is a graph illustrating an operation of resetting a Coulomb counter, in which the vertical axis represents battery capacity (%) and the horizontal axis represents time (h). As illustrated in FIG. 1, the Coulomb counter is set to 0% at a certain timing t1, and measurement then starts. Charging starts, and when a full charge state or a full charge state specified by a manufacturer is reached, the Coulomb counter is set to 100% at an arrival timing t2. Discharging starts, and when a discharge stop voltage or a voltage specified by a manufacturer is reached, the Coulomb counter is set to 0% at an arrival timing t4. Once the accumulated error of the Coulomb counter is reset by setting the battery capacity to 0%, it is possible to correct the battery capacity.

In general, a residual capacity alarm is issued in a battery capacity of 10%, and a shut-down alarm is issued in a battery capacity of 4%. Thus, before the discharge stop voltage or the manufacturer-specified voltage is reached, charging starts (time t3) and errors are accumulated little by little.

[OCV Measurement Method]

In a state where a load is not connected to the storage battery, there is a characteristic that a voltage value (OCV) appearing in a battery terminal is proportional to an amount of electric charges stored in the storage battery. A method of estimating a state of charge (SOC) from a voltage when there is no load using such characteristic is an OCV measurement method. In the OCV measurement method, an SOC is uniquely determined by simply detecting a terminal voltage of a storage battery, but a load device receiving power from the storage battery is actually rare in a no-load state. Thus, in some cases, the SOC is estimated in consideration of internal resistance of a storage battery itself and an amount of load of a load device.

Figure 2A:
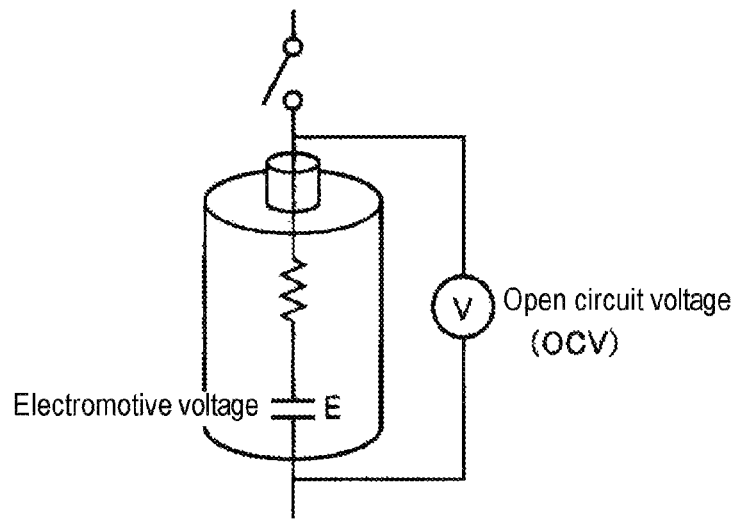
FIG. 2A is a schematic circuit illustrating OCV measurement and FIG. 2B is a graph illustrating a relationship between OCV and SOC.
Figure 2B:
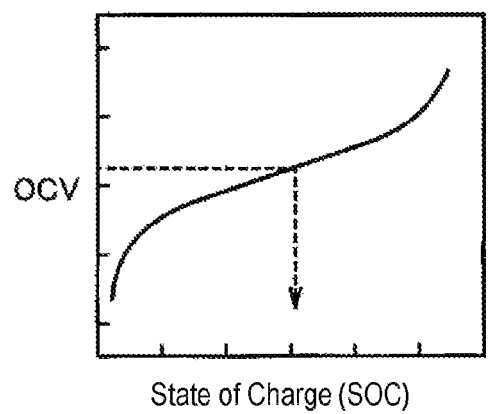

FIGS. 2A and 2B are views illustrating the OCV measurement method, in which FIG. 2A is a schematic circuit diagram and FIG. 2B is a graph illustrating a relationship between OCV and SOC. As illustrated in FIG. 2A, the OCV is a terminal voltage measured when the movement of ions within a storage battery is in a state of equilibrium after the storage battery is separated from a load device. The relationship between the OCV and the SOC is changed at a substantially constant ratio as illustrated in FIG. 2B.

Figure 3:
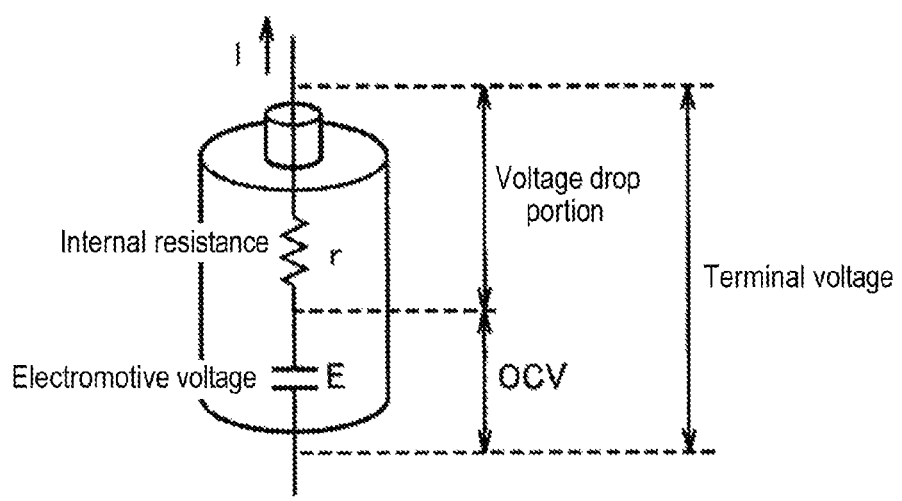
FIG. 3 is a schematic circuit diagram illustrating a relationship between OCV and an internal resistance.

FIG. 3 illustrates a relationship between the OCV and internal resistance r. As illustrated in FIG. 3, in the OCV measurement method, there is a case of using a voltage drop portion. The voltage drop portion is a voltage applied to the internal resistance r of the storage battery, which is obtained by the product of the internal resistance r and a load current I. When the voltage drop portion is obtained, the OCV is obtained as expressed by the following equation, so that the SOC may be estimated.

OCV=measured voltage value+
internal resistance r*load current I

However, since the internal resistance r is changed depending on composition, a use history, and a temperature of the storage battery, it is difficult to accurately measure the internal resistance r and the calculation thereof is also complicated.

Comparative Example

Figure 4:
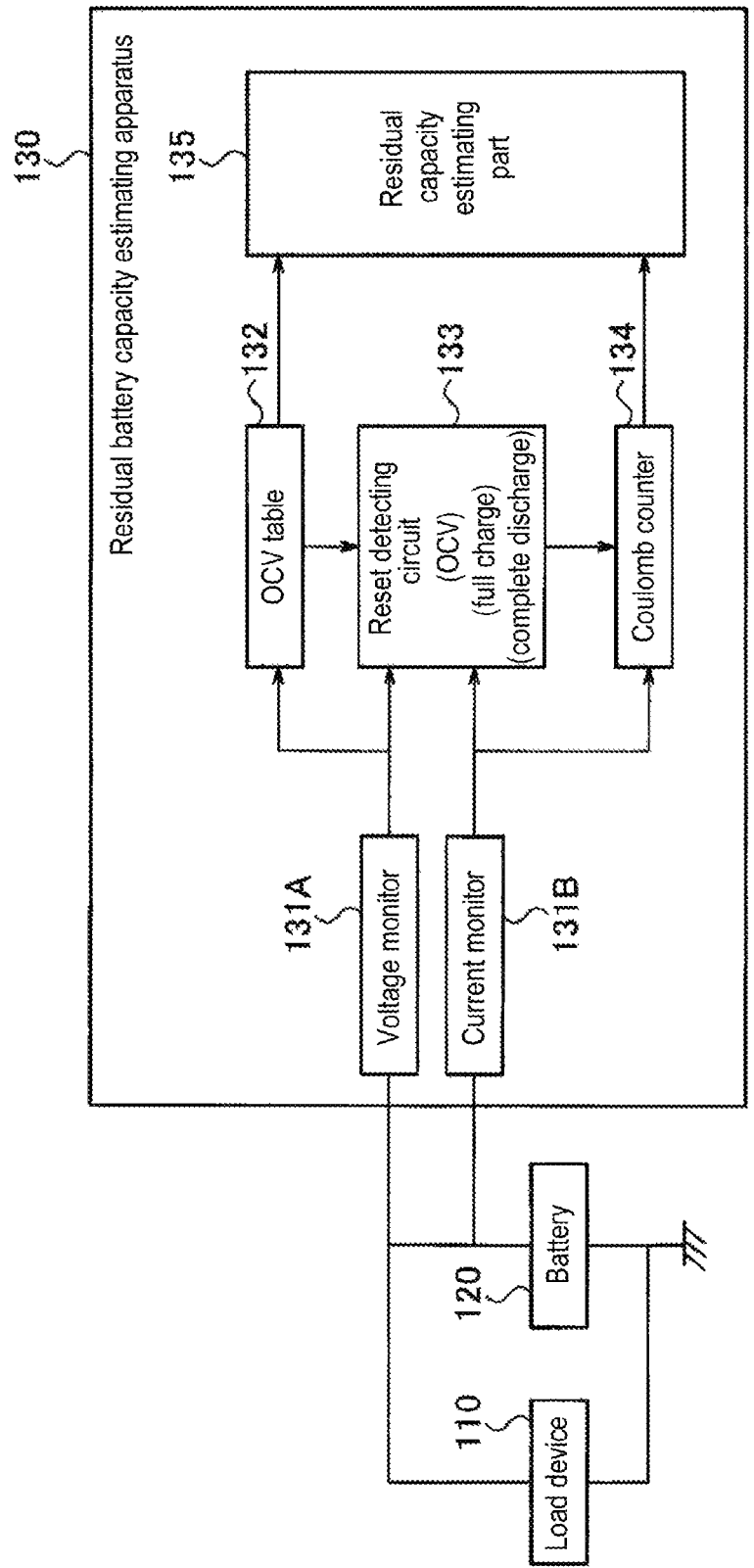
FIG. 4 is a schematic block diagram of an apparatus for estimating a residual battery capacity according to a comparative example.

A schematic block diagram of a residual battery capacity estimating apparatus 130 according to a comparative example is illustrated in FIG. 4. As illustrated in FIG. 4, the residual battery capacity estimating apparatus 130 and a load device 110 are connected to a battery 120 such as a lithium ion battery.

The residual battery capacity estimating apparatus 130 includes a voltage monitor 131A, a current monitor 131B, an OCV table 132, a reset detecting circuit 133, a Coulomb counter 134, and a residual capacity estimating part 135. That is, a hybrid scheme that combines a Coulomb counting method and an OCV measurement method is adopted, in which an accumulated error of the Coulomb counter 134 is controlled to be reset at a timing of OCV, full charge (100%), or complete discharge (0%). However, as mentioned above, the OCV measurement method has a problem in that accurate measurement is difficult, or the like, and the Coulomb counting method has a problem in that it is difficult to reset an accumulated error, or the like.

First Embodiment (Residual Battery Capacity Estimating Apparatus)

Figure 5:
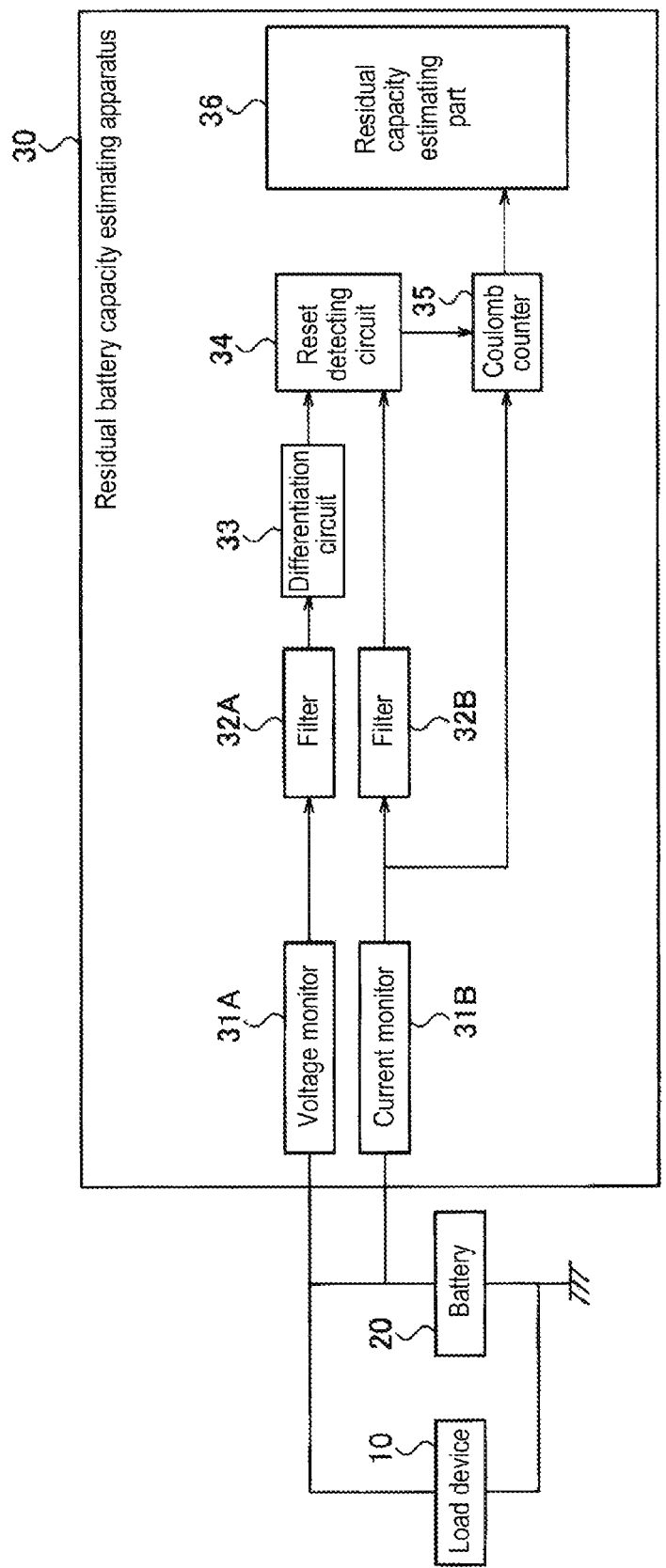
FIG. 5 is a schematic block diagram of an apparatus for estimating residual battery capacity according to a first embodiment.

A schematic block diagram of a residual battery capacity estimating apparatus 30 according to a first embodiment is illustrated in FIG. 5. As illustrated in FIG. 5, the residual battery capacity estimating apparatus 30 according to the first embodiment is an apparatus for estimating a residual capacity of a battery 20 including an electrode of which stage structure is changed based on an SOC. The residual battery capacity estimating apparatus 30 includes a current monitor 31B for monitoring a current value flowing in the battery 20, a voltage monitor 31A for monitoring a voltage value of the battery 20, a Coulomb counter 35 for integrating the current value monitored by the current monitor 31B, a differentiation circuit 33 for detecting a differential value of the voltage value monitored by the voltage monitor 31A, a reset detecting circuit for resetting an accumulated error due to current integration of the Coulomb counter 35 by using an inflection point of the differential value detected by the differentiation circuit 33, and a residual capacity estimating part 36 for estimating a residual capacity of the battery 20 based on the value of the Coulomb counter 35.

Specifically, a negative electrode of the battery 20 may have a stage structure in which lithium is regularly occluded in a graphite layer.

Also, when the stage structures are Lic18, Lic12, and Lic6, the residual capacity estimating part 36 may estimate residual capacities of the battery 20 as 33%, 50%, and 100% in the respective cases. Here, "33%, 50%, and 100%" are examples.

Also, the reset detecting circuit 34 may have a threshold value with respect to the battery characteristics of the battery 20, and when a differential value is equal to or greater than the threshold value, the reset detecting circuit 34 may reset an accumulated error.

Also, the differentiation circuit 33 may detect a differential value when the battery 20 is charged.

Also, a filter 32A for removing noise of a voltage of the battery 20 may be provided at a front end of the differentiation circuit 33.

Also, a filter 32B for removing noise of a current flowing in the battery 20 may be provided at a front end of the reset detecting circuit 34.

Also, various devices such as a portable device (for example, a mobile phone, a smart phone, or a game machine), an automobile, a bicycle, and various types of electrical storage systems using a storage battery such as a lithium ion battery as a power source may be used as the load device 10.

(Stage Structure)

Figure 6:
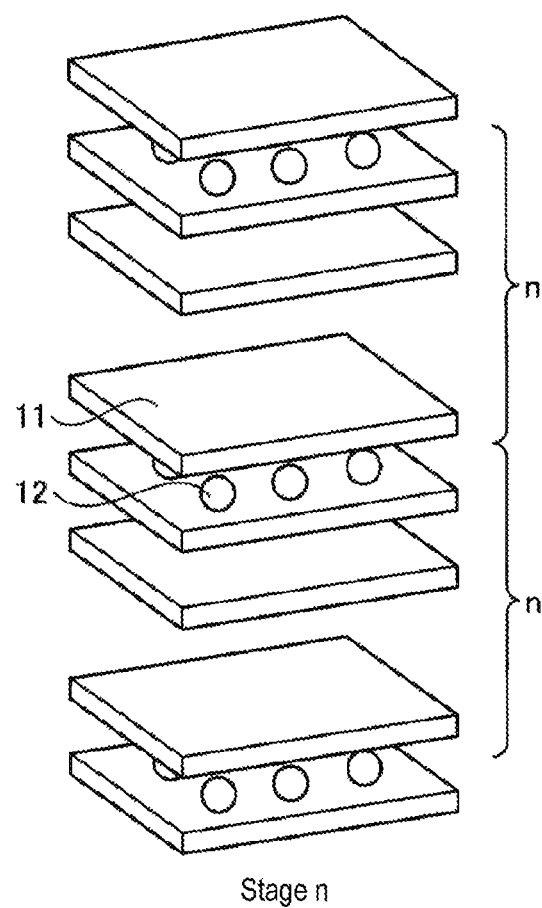
FIG. 6 is a schematic perspective view illustrating a stage structure of a negative electrode of a lithium ion battery provided in an apparatus for estimating a residual battery capacity according to the first embodiment.

FIG. 6 illustrates a stage structure of a negative electrode of a lithium ion battery provided in the residual battery capacity estimating apparatus 30 according to the first embodiment. In the lithium ion battery, lithium ions escape from a positive electrode material and enter a negative electrode material during the charging, and an inverse reaction occurs during the discharging, and thus, the lithium ion battery serves as a battery. In general, a carbon material such as graphite 11 is used as the negative electrode material of the lithium ion battery, and lithium ions 12 are inserted between layers of the carbon material in a charging reaction.

Figure 7:
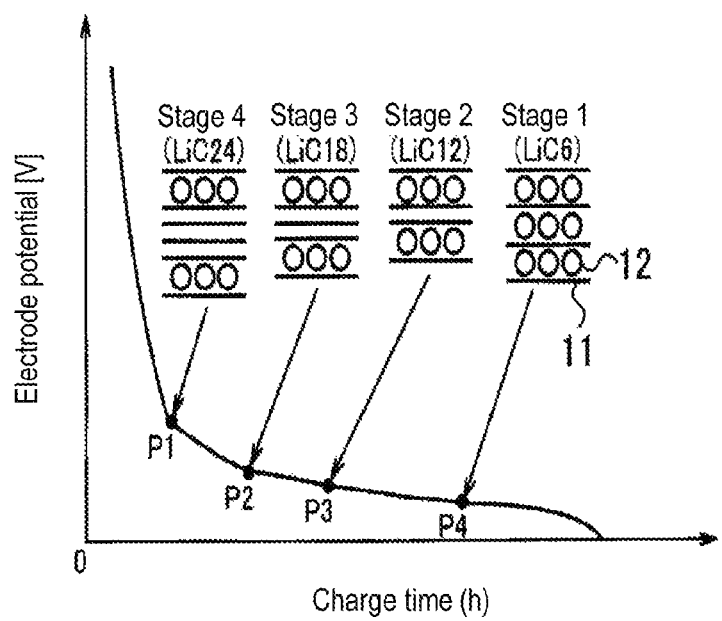
FIG. 7 is a graph illustrating a change in a potential when lithium ions are inserted into graphite illustrated in FIG. 6.

FIG. 7 illustrates a change in potential when lithium ions 12 are inserted into the graphite 11 illustrated in FIG. 6. As illustrated in FIG. 7, a stage structure is formed in which the lithium ions 12 enter between the layers of the graphite 11 and lithium is regularly occluded per specific layers. In the case of graphite, since the lithium ions 12 are inserted while forming a stage compound as illustrated in FIG. 6, an electrode potential is changed while showing several potential flat portions. Specifically, the electrode potential is changed stepwise to a stage 4 represented by LiC24, a stage 3 represented by LiC18, a stage 2 represented by LiC12, and a stage 1 represented by LiC6. These charge/discharge curve has inflection points P1, P2, P3, and P4 present at positions respectively corresponding to the stages 4, 3, 2, and 1.

(Residual Battery Capacity Estimating Method)

Figure 8:
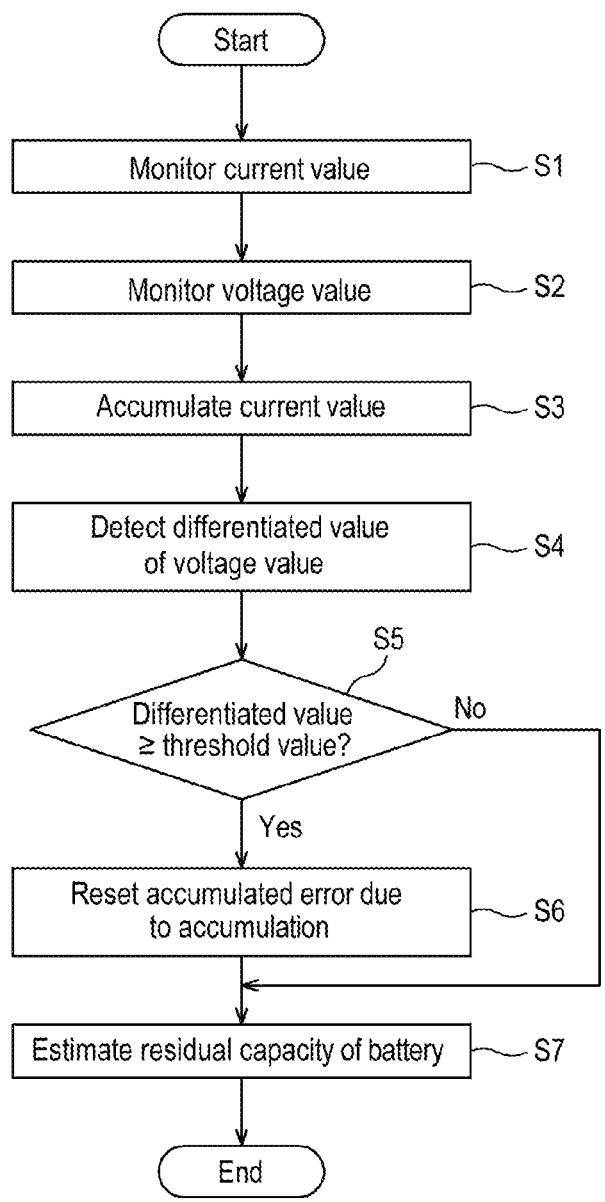
FIG. 8 is a flowchart illustrating a method for estimating a residual battery capacity according to the first embodiment.

FIG. 8 illustrates a method for estimating a residual battery capacity by the residual battery capacity estimating apparatus 30 according to the first embodiment. This residual battery capacity estimating method is a method for estimating a residual battery capacity, which is performed by the residual battery capacity estimating apparatus 30 including an electrode whose stage structure is changed based on an SOC, and has steps S1 to S7 as follows.

In step S1, the current monitor 31B monitors a current value flowing in the battery 20. Noise of the current may be removed by the filter 32B.

In step S2, the voltage monitor 31A monitors a voltage value of the battery 20. The voltage value of the battery 20 mentioned herein is a potential difference between a positive electrode and a negative electrode of the battery 20. Noise of the voltage may be removed by the filter 32A.

In step S3, the Coulomb counter 35 integrates the current value monitored in step S1. For example, the Coulomb counter 35 may measure a charge/discharge current of the battery 20 at a predetermined time interval (one second or a few seconds), sets an amount of electric charges obtained by multiplying the time interval to the measured current as a charge amount or a discharge amount at that time, and integrates it to calculate the sum of the charged amounts of electric charges or the discharged amounts of electric charges.

In step S4, the differentiation circuit 33 detects a differential value of the voltage value monitored in step S2. That is, since the charge/discharge curve has slopes at the stage changes (see FIG. 7), the differentiation circuit 33 detects the slopes.

Further, since a constant current flows during the charging of the battery 20, compared with the discharging of the battery 20, it is easy to calculate a differential value. Thus, the differentiation circuit 33 may detect a differential value when the battery 20 is charged. Also, in a current state where a load fluctuates, it is preferred to calculate a variation in a voltage according to an amount of flowing current.

In steps S5 and S6, the reset detecting circuit 34 resets an accumulated error due to the current integration of the Coulomb counter 35 by using the inflection points of the differential value detected in step S4. For example, when the inflection point P2 corresponding to the stage 3 (Lic18) is detected, the inflection point P3 corresponding to the stage 2 (Lic12) is detected and the inflection point P4 corresponding to the stage 1 (Lic16) is detected, the reset detecting circuit 34 transmits a reset signal to the Coulomb counter 35.

Thus, the Coulomb counter 35 is reset by the detection level of the differential value of the battery voltage. Specifically, when the differential value of the battery voltage is equal to or greater than a predetermined threshold value (YES in step S5), an accumulated error is controlled to be reset. Since an actually used battery capacity range varies depending on each completed battery 20, it is preferred to measure characteristics of each battery and determine a threshold value based on the battery characteristics in advance.

In step S7, the residual capacity estimating part 36 estimates a residual capacity of the battery 20 based on the value of the Coulomb counter 35. Specifically, the negative electrode formed of graphite has stage changes such as Lic18, Lic12, and Lic6, and each of the changes is converted into a residual battery capacity.

(Residual Battery Capacity Estimating System)

Figure 9:
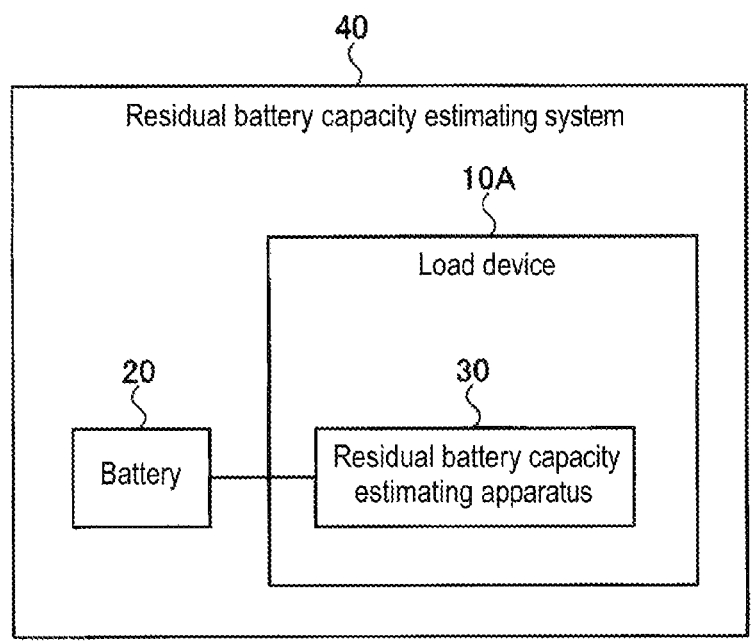
FIG. 9 is a schematic block diagram of a system for estimating a residual battery capacity according to the first embodiment.

A schematic block diagram of the residual battery capacity estimating system 40 according to the first embodiment is illustrated in FIG. 9. As illustrated in FIG. 9, the residual battery capacity estimating system 40 according to the first embodiment includes the battery 20 including an electrode whose stage structure is changed based on an SOC and a load device 10A such as a smart phone or a mobile phone to which power is supplied from the battery 20. The load device 10A has the residual battery capacity estimating apparatus 30 for estimating a residual capacity of the battery 20. The load device 10A may have a display part for displaying the residual capacity of the battery 20, and the like. The residual battery capacity estimating apparatus 30 may be realized as a residual battery capacity estimating IC formed by integrating electronic components on a single chip. It is understood that the configuration of the residual battery capacity estimating apparatus 30 is the same as described above.

(Battery Pack)

Figure 10:
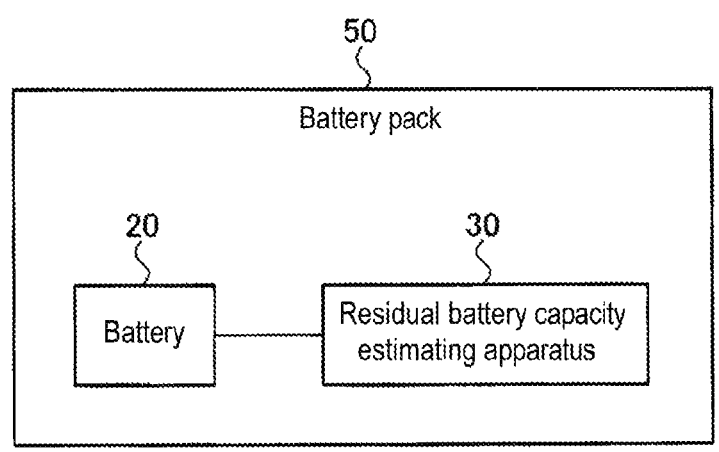
FIG. 10 is a schematic block diagram of a battery pack according to the first embodiment.

A schematic block diagram of a battery pack according to the first embodiment is illustrated in FIG. 10. As illustrated in FIG. 10, the battery pack 50 according to the first embodiment has the battery 20 including an electrode whose stage structure is changed based on an SOC and the residual battery capacity estimating apparatus 30 for estimating a residual capacity of the battery 20. The battery pack 50 may have a protective circuit for protecting the battery 20 from excessive charging or excessive discharging, and the like. The residual battery capacity estimating apparatus 30 may be realized as a residual battery capacity estimating IC formed by integrating electronic components on a single chip. It is understood that the configuration of the residual battery capacity estimating apparatus 30 is the same as described above.

As described above, according to the first embodiment, it is possible to reset an accumulated error by using the stage change of the negative electrode in the residual battery capacity estimating apparatus 30 using the Coulomb counter 35. Also, since the OCV measurement method requiring the creation of a table in advance is not used, it is possible to omit or simplify complicated processing such as the estimation of a resistance value, or the like.

In the case of using a phosphoric acid compound having an olivine structure as a positive electrode material of a lithium ion battery, a region in which a charge/discharge curve is flat is lengthened. According to the battery having a long flat region section, since resetting based on OCV is difficult, a technique that does not use the OCV measurement method as in this embodiment is particularly effective.

Second Embodiment

Hereinafter, only differences in a second embodiment from the first embodiment will be described.

(Residual Battery Capacity Estimating Apparatus)

Figure 11:
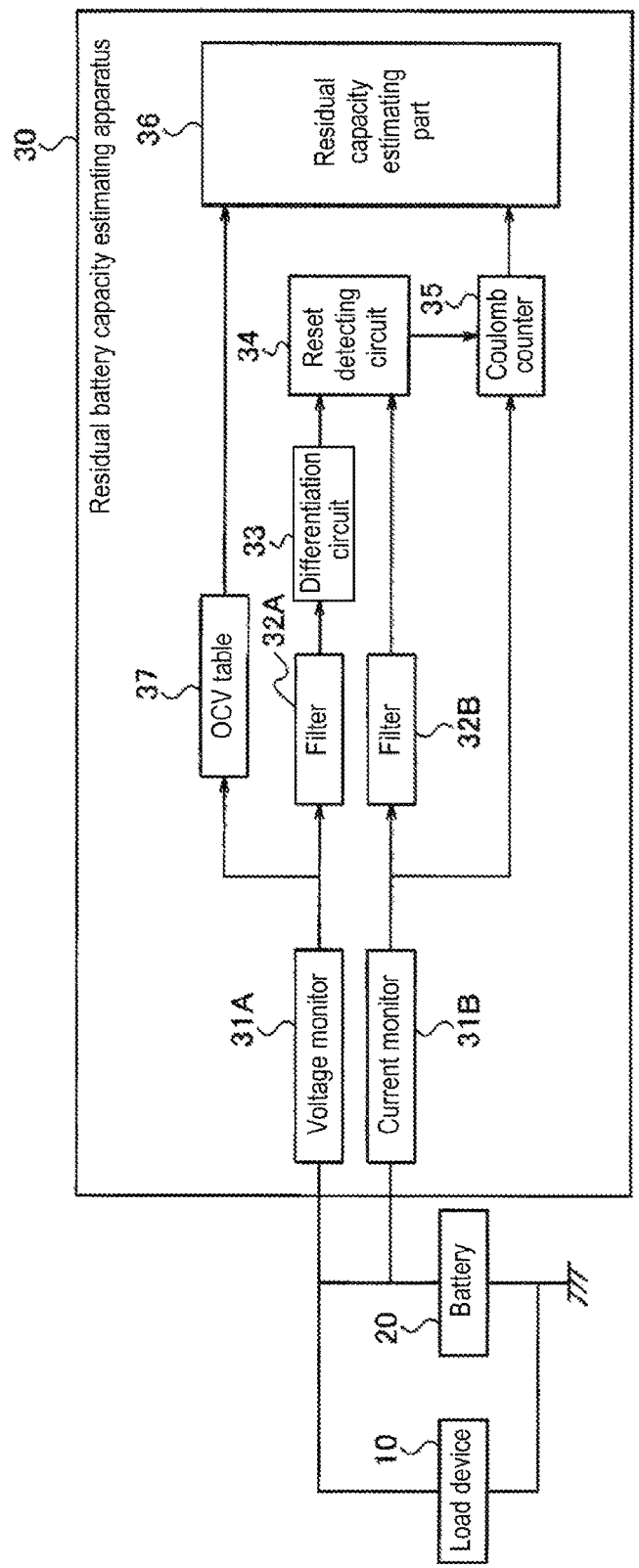
FIG. 11 is a schematic block diagram of an apparatus for estimating a residual battery capacity according to a second embodiment.

A schematic block diagram of a residual battery capacity estimating apparatus 30 according to the second embodiment is illustrated in FIG. 11. As illustrated in FIG. 11, the residual battery capacity estimating apparatus 30 according to the second embodiment further includes an OCV table 37 obtained by measuring an OCV of the battery 20 in advance, and the residual capacity estimating part 36 estimates a residual capacity of the battery 20 based on the OCV retained in the table 37. The OCV measurement method is the same as described above.

(Residual Battery Capacity Estimating Method)

Figure 12:
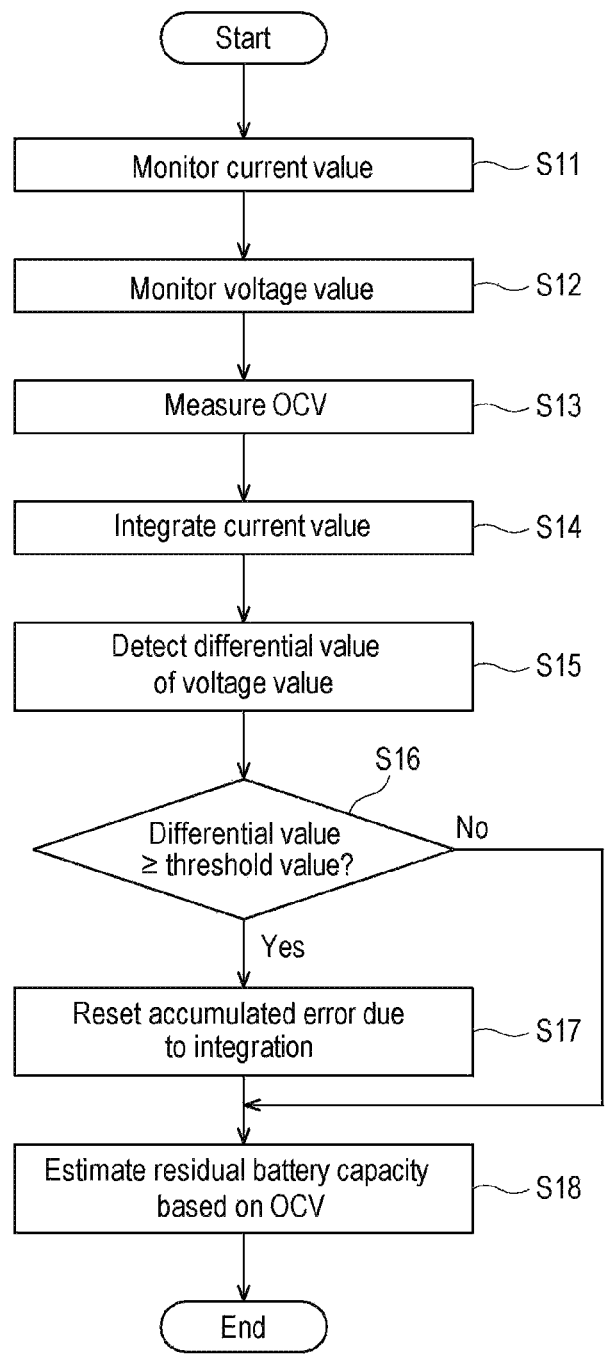
FIG. 12 is a flowchart illustrating a method for estimating a residual battery capacity according to the second embodiment.

FIG. 12 illustrates a method for estimating a residual battery capacity by the residual battery capacity estimating apparatus 30 according to the second embodiment. As illustrated in FIG. 12, the method further includes step S13 of measuring an OCV to create an OCV table 37 in advance, and in step S18, the residual capacity estimating part 36 estimates a residual capacity of the battery 20 based on the OCV retained in the OCV table 37.

As described above, according to the second embodiment, a residual capacity of the battery 20 can be estimated based on the OCV of the battery 20. Thus, it is possible to more precisely estimate the residual capacity of the battery 20 than that of the first embodiment.

Third Embodiment

Hereinafter, only differences in a third embodiment from the first and second embodiments will be described.

(Residual Battery Capacity Estimating Apparatus)

Figure 13:
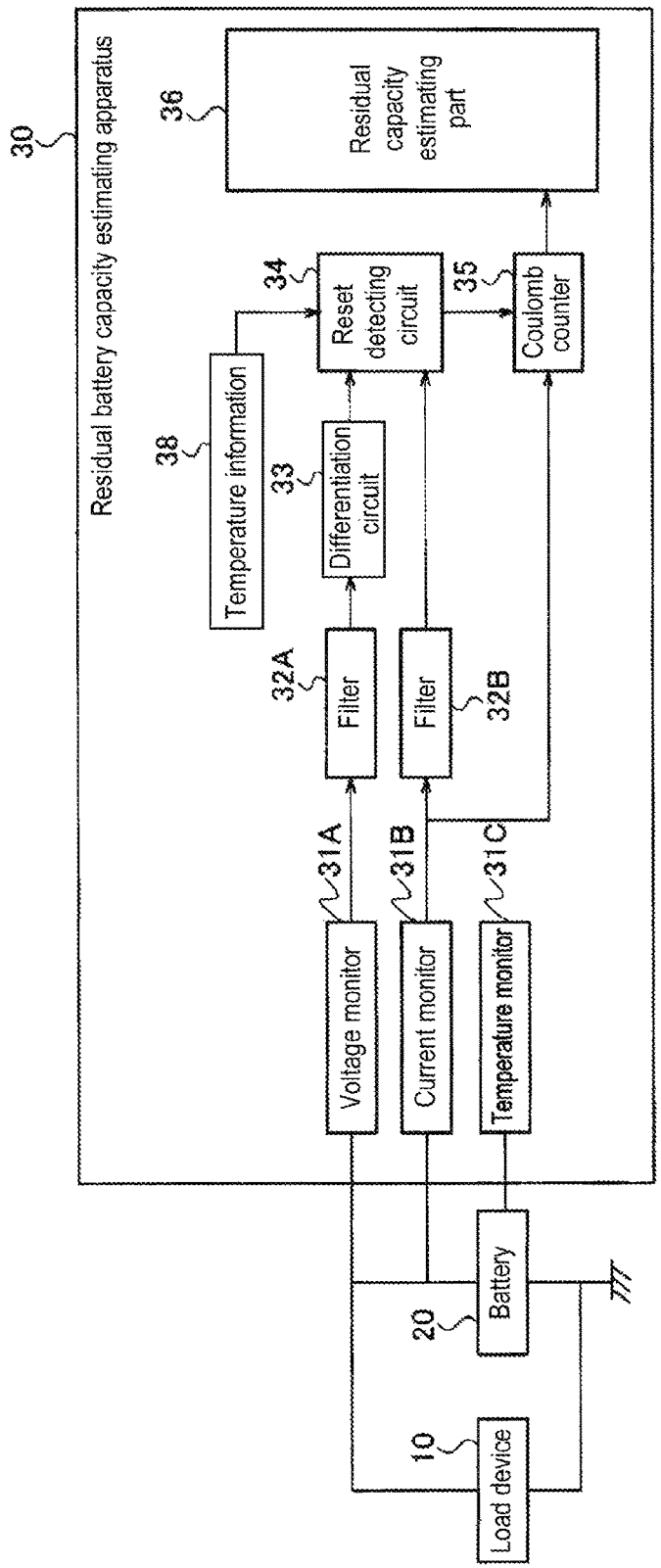
FIG. 13 is a schematic block diagram of an apparatus for estimating a residual battery capacity according to a third embodiment.

A schematic block diagram of a residual battery capacity estimating apparatus 30 according to the third embodiment is illustrated in FIG. 13. As illustrated in FIG. 13, the residual battery capacity estimating apparatus 30 according to the third embodiment further includes a temperature monitor 31C for monitoring a temperature of the battery 20, and the reset detecting circuit 34 detects an inflection point of a differential value based on temperature information 38 monitored by the temperature monitor 31C. The temperature monitor 31C may be a thermistor, or any other temperature sensor or the like, but the present disclosure is not particularly limited thereto.

(Residual Battery Capacity Estimating Method)

Figure 14:
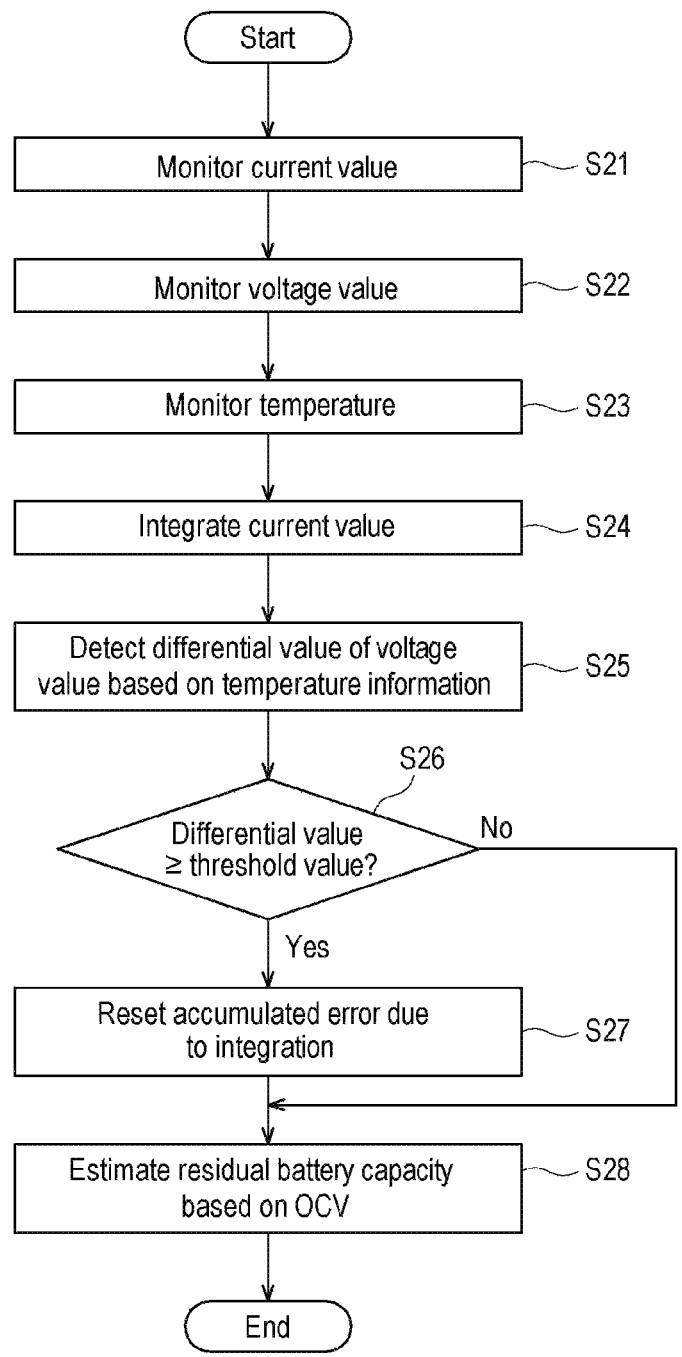
FIG. 14 is a flowchart illustrating a method for estimating a residual battery capacity according to the third embodiment.

FIG. 14 illustrates a method for estimating a residual battery capacity by the residual battery capacity estimating apparatus 30 according to the third embodiment. As illustrated in FIG. 14, the method further includes step S23 of monitoring a temperature of the battery 20 by the temperature monitor 31C, and in step S25, the reset detecting circuit 34 detects an inflection point of a differential value based on the temperature information 38 monitored by the temperature monitor 31C.

As described above, according to the third embodiment, since the inflection point of the differential value is detected based on the temperature of the battery 20, a stage change of the negative electrode can be more specifically recognized. Thus, it is possible to more precisely estimate the residual capacity of the battery 20 than that of the first embodiment.

Fourth Embodiment

Hereinafter, only differences in a fourth embodiment from the first to third embodiments will be described.

(Residual Battery Capacity Estimating Apparatus)

Figure 15:
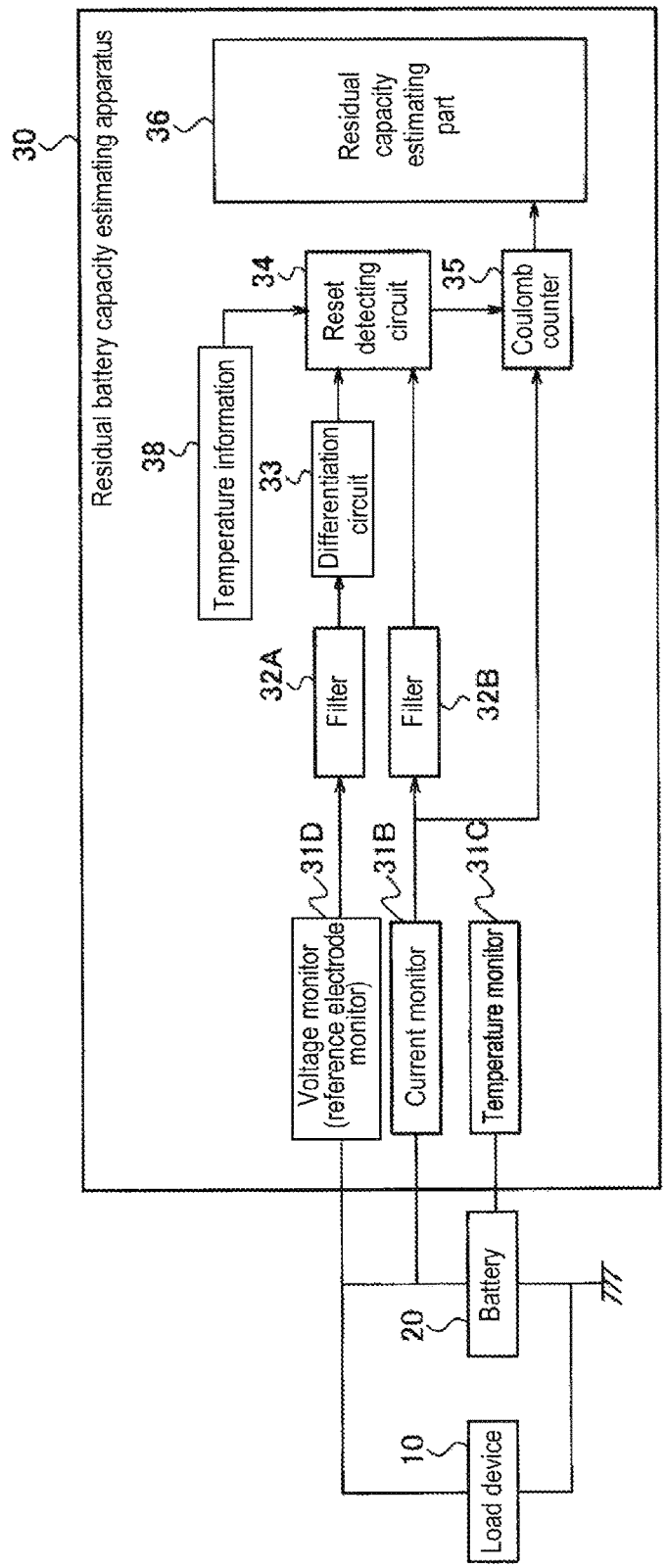
FIG. 15 is a schematic block diagram of an apparatus for estimating a residual battery capacity according to a fourth embodiment.

A schematic block diagram of a residual battery capacity estimating apparatus 30 according to the fourth embodiment is illustrated in FIG. 15. As illustrated in FIG. 15, the battery 20 has a positive electrode, a negative electrode, and a reference electrode, and a voltage monitor (a reference electrode monitor) 31D monitors a potential difference between the negative electrode and the reference electrode, and the reset detecting circuit 34 detects an inflection point of a differential value based on the potential difference between the negative electrode and the reference electrode monitored by the voltage monitor 31D. The reference electrode is an electrode providing a reference point of a potential when an electrode potential is measured. The reference electrode may be an electrode having a stable potential to provide desirable reproducibility, and a material thereof and the like are not particularly limited.

(Residual Battery Capacity Estimating Method)

FIG. 16 illustrates a method for estimating a residual battery capacity by the residual battery capacity estimating apparatus 30 according to the fourth embodiment. As illustrated in FIG. 16, in step S32, a potential difference between a negative electrode and a reference electrode is monitored, and in step S35, the reset detecting circuit 34 detects an inflection point of a differential value based on the potential difference between the negative electrode and the reference electrode monitored by the voltage monitor 31D.

Also, it is described here that the differential value between the negative electrode and the reference electrode is detected, but the present disclosure is not limited thereto. That is, the voltage monitor 31D may monitor a potential difference between the positive electrode and the reference electrode (step S32), and the reset detecting circuit 34 may detect an inflection point of a differential value based on the potential difference between the positive electrode and the reference electrode monitored by the voltage monitor 31D (step S35)

As described above, according to the fourth embodiment, when the battery 20 having the reference electrode is used, since the potentials of the positive electrode and the negative electrode of the battery 20 are independently monitored, a stage change of the negative electrode can be more specifically recognized. Thus, it is possible to more precisely estimate the residual capacity of the battery 20 than that of the first embodiment.

As described above, according to the embodiments, it is possible to provide the residual battery capacity estimating apparatus, the residual battery capacity estimating system, the battery pack, and the residual battery capacity estimating method, which are capable of precisely estimating a residual capacity of a storage battery through simple processing.

Other Embodiments

While the first to fourth embodiments have been described as above, the description and drawings that form part of the present disclosure are exemplary and should not be understood as limiting. In the present disclosure, various substitute embodiments, examples, and operation techniques will be apparent to a person skilled in the art.

In the first to fourth embodiments, the case of using the lithium ion battery including the negative electrode such as graphite has been described, but the storage battery is not limited to the lithium ion battery. Also, the negative electrode material is not limited to graphite and does not focus only on the characteristics of the negative electrode.

For example, although the stage characteristic of the negative electrode material has been described, the estimation may be performed in the same manner for the positive electrode if a differential value of the positive electrode material as a threshold value based on a change of the stage structure or the like can be detected. Also, it is possible to obtain more specific information if the information about the positive electrode and the negative electrode can be obtained individually using the reference electrode.

In this manner, the present disclosure encompasses various embodiments or the like that are not described herein.

The residual battery capacity estimating apparatus, the residual battery capacity estimating system, the battery pack, and the residual battery capacity estimating method according the embodiments can be applied to various applications such as a portable device (for example, a mobile phone, a smart phone, or a game machine), an automobile, a bicycle, and various electrical storage systems using a storage battery such as a lithium ion battery as a power source.

According to the present disclosure in some embodiments, it is possible to provide an apparatus for estimating a residual battery capacity, a system for estimating a residual battery capacity, a battery pack, and a method for estimating a residual a battery capacity, which are capable of precisely estimating a residual capacity of a storage battery through simple processing.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for estimating a residual capacity of a storage battery including an electrode whose stage structure is changed based on a state of charge, comprising:
    a current monitor configured to monitor a current value flowing in the storage battery;
    a voltage monitor configured to monitor a voltage value of the storage battery;
    a Coulomb counter configured to integrate the current value monitored by the current monitor;
    a differentiation circuit configured to detect a differential value of the voltage value monitored by the voltage monitor;
    a reset detecting circuit configured to reset an accumulated error due to current integration of the Coulomb counter using an inflection point of the differential value detected by the differentiation circuit; and
    a residual capacity estimating part configured to estimate a residual capacity of the storage battery based on a value of the Coulomb counter,
    wherein the storage battery has a positive electrode, a negative electrode, and a reference electrode,
    wherein the voltage monitor is configured to monitor a potential difference between the negative electrode and the reference electrode, and
    wherein the reset detecting circuit is configured to detect the inflection point of the differential value based on the potential difference between the negative electrode and the reference electrode monitored by the voltage monitor.

2. The apparatus of claim 1, wherein the negative electrode of the storage battery has a stage structure in which lithium is regularly occluded in a graphite layer.

3. The apparatus of claim 2, wherein when the stage structure is Lic18, Lic12, and Lic6, the residual capacity estimating part is configured to estimate residual capacities of the storage battery as 33%, 50%, and 100% in respective cases.

4. The apparatus of claim 1, wherein the reset detecting circuit has a threshold value based on battery characteristics of the storage battery, and is configured to reset the accumulated error when the differential value is equal to or greater than the threshold value.

5. The apparatus of claim 1, wherein the differentiation circuit is configured to detect the differential value when the storage battery is charged.

6. The apparatus of claim 1, further comprising an open circuit voltage (OCV) table having an OCV of the storage battery measured in advance,
    wherein the residual capacity estimating part is configured to estimate a residual capacity of the storage battery based on the OCV retained in the OCV table.

7. The apparatus of claim 1, further comprising a temperature monitor configured to monitor a temperature of the storage battery,
    wherein the reset detecting circuit is configured to detect the inflection point of the differential value based on temperature information monitored by the temperature monitor.

8. A system for estimating a residual capacity of a battery, comprising:
    a storage battery including an electrode whose stage structure is changed based on a state of charge; and
    a load device configured to receive power from the storage battery,
    wherein the load device comprises a residual battery capacity estimating apparatus for estimating a residual capacity of the storage battery, and
    the residual battery capacity estimating apparatus comprises:
    a current monitor configured to monitor a current value flowing in the storage battery;
    a voltage monitor configured to monitor a voltage value of the storage battery;
    a Coulomb counter configured to integrate the current value monitored by the current monitor;
    a differentiation circuit configured to detect a differential value of the voltage value monitored by the voltage monitor;
    a reset detecting circuit configured to reset an accumulated error due to current integration of the Coulomb counter using an inflection point of the differential value detected by the differentiation circuit; and
    a residual capacity estimating part configured to estimate a residual capacity of the storage battery based on a value of the Coulomb counter,
    wherein the storage battery has a positive electrode, a negative electrode, and a reference electrode,
    wherein the voltage monitor is configured to monitor a potential difference between the negative electrode and the reference electrode, and
    wherein the reset detecting circuit is configured to detect the inflection point of the differential value based on the potential difference between the negative electrode and the reference electrode monitored by the voltage monitor.

9. The system of claim 8, wherein the negative electrode of the storage battery has a stage structure in which lithium is regularly occluded in a graphite layer.

10. The system of claim 9, wherein when the stage structure is Lic18, Lic12, and Lic6, the residual capacity estimating part is configured to estimate residual capacities of the storage battery as 33%, 50%, and 100% in respective cases.

11. The system of claim 8, wherein the reset detecting circuit has a threshold value based on battery characteristics of the storage battery, and is configured to reset the accumulated error when the differential value is equal to or greater than the threshold value.

12. The system of claim 8, wherein the differentiation circuit is configured to detect the differential value when the storage battery is charged.

13. The system of claim 8, further comprising an open circuit voltage (OCV) table having an OCV of the storage battery measured in advance,
wherein the residual capacity estimating part is configured to estimate a residual capacity of the storage battery based on the OCV retained in the OCV table.

14. The system of claim 8, further comprising a temperature monitor configured to monitor a temperature of the storage battery,
wherein the reset detecting circuit is configured to detect an inflection point of the differential value based on temperature information monitored by the temperature monitor.

15. A battery pack, comprising:
a storage battery including an electrode whose stage structure is changed based on a state of charge; and
a residual battery capacity estimating apparatus for estimating a residual capacity of the storage battery,
wherein the residual battery capacity estimating apparatus comprises:
a current monitor configured to monitor a current value flowing in the storage battery;
a voltage monitor configured to monitor a voltage value of the storage battery;
a Coulomb counter configured to integrate the current value monitored by the current monitor;
a differentiation circuit configured to detect a differential value of the voltage value monitored by the voltage monitor;
a reset detecting circuit configured to reset an accumulated error due to current integration of the Coulomb counter using an inflection point of the differential value detected by the differentiation circuit; and
a residual capacity estimating part configured to estimate a residual capacity of the storage battery based on a value of the Coulomb counter,
wherein the storage battery has a positive electrode, a negative electrode, and a reference electrode,
wherein the voltage monitor is configured to monitor a potential difference between the negative electrode and the reference electrode, and
wherein the reset detecting circuit is configured to detect the inflection point of the differential value based on the potential difference between the negative electrode and the reference electrode monitored by the voltage monitor.

16. The battery pack of claim 15, wherein the negative electrode of the storage battery has a stage structure in which lithium is regularly occluded in a graphite layer.

17. The battery pack of claim 16, wherein when the stage structure is $Lic18$, $Lic12$, and $Lic6$, the residual capacity estimating part is configured to estimate residual capacities of the storage battery as 33%, 50%, and 100% in respective cases.

18. The battery pack of claim 15, wherein the reset detecting circuit has a threshold value based on battery characteristics of the storage battery, and is configured to reset the accumulated error when the differential value is equal to or greater than the threshold value.

19. The battery pack of claim 15, wherein the differentiation circuit is configured to detect the differential value when the storage battery is charged.

20. The battery pack of claim 15, further comprising an open circuit voltage (OCV) table having an OCV of the storage battery measured in advance,
wherein the residual capacity estimating part is configured to estimate a residual capacity of the storage battery based on the OCV retained in the OCV table.

21. The battery pack of claim 15, further comprising a temperature monitor configured to monitor a temperature of the storage battery,
wherein the reset detecting circuit is configured to detect the inflection point of the differential value based on temperature information monitored by the temperature monitor.

* * * * *